United States Patent
Wada et al.

(10) Patent No.: US 9,042,078 B2
(45) Date of Patent: May 26, 2015

(54) ELECTROSTATIC CHUCK

(71) Applicant: TOTO LTD., Kitakyushu-Shi, Fukuoka (JP)

(72) Inventors: Takuma Wada, Fukuoka-Ken (JP); Kazuki Anada, Fukuoka-Ken (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 14/345,279

(22) PCT Filed: Sep. 27, 2012

(86) PCT No.: PCT/JP2012/074867
§ 371 (c)(1),
(2) Date: Mar. 17, 2014

(87) PCT Pub. No.: WO2013/047648
PCT Pub. Date: Apr. 4, 2013

(65) Prior Publication Data
US 2014/0355170 A1    Dec. 4, 2014

(30) Foreign Application Priority Data

Sep. 30, 2011  (JP) ................................ 2011-217488
Sep. 21, 2012  (JP) ................................ 2012-208984

(51) Int. Cl.
| | |
|---|---|
| *H01T 23/00* | (2006.01) |
| *H01L 21/683* | (2006.01) |
| *B23Q 3/154* | (2006.01) |
| *H01L 21/67* | (2006.01) |
| *H01L 21/687* | (2006.01) |

(52) U.S. Cl.
CPC .......... *H01L 21/6831* (2013.01); *B23Q 3/1543* (2013.01); *H01L 21/6833* (2013.01); *H01L 21/67109* (2013.01); *H01L 21/6875* (2013.01)

(58) Field of Classification Search
USPC .................................................. 361/230, 234
See application file for complete search history.

(56) References Cited

U.S. PATENT DOCUMENTS

| | | | |
|---|---|---|---|
| 6,020,076 A | | 2/2000 | Fujii et al. |
| 6,151,203 A | * | 11/2000 | Shamouilian et al. ........ 361/234 |
| 6,303,879 B1 | * | 10/2001 | Burkhart ....................... 174/261 |

(Continued)

FOREIGN PATENT DOCUMENTS

| | | |
|---|---|---|
| JP | S62-264638 A | 11/1987 |
| JP | H09-162272 A | 6/1997 |

(Continued)

*Primary Examiner* — Danny Nguyen
(74) *Attorney, Agent, or Firm* — Carrier Blackman & Associates, P.C.; Joseph P. Carrier; William D. Blackman

(57) ABSTRACT

An electrostatic chuck includes: a ceramic dielectric substrate having a first major surface and a second major surface; an electrode interposed between the first and second major surfaces; and a connecting part connected to the electrode and including a first region in contact with the electrode, with a first direction being defined as a direction from the first major surface toward the second major surface, and a second direction being defined as a direction orthogonal to the first direction, the first region being configured so that in a cross section of the electrode and the connecting part as viewed in the second direction, an angle on a side of the connecting part between an extension line along outer shape on the side of second major surface of the electrode and a tangential line of outer shape of the connecting part gradually increases in the first direction.

15 Claims, 13 Drawing Sheets

(56) References Cited

U.S. PATENT DOCUMENTS

| | | | |
|---|---|---|---|
| 6,490,144 B1 * | 12/2002 | Narendrnath et al. | 361/234 |
| 6,831,823 B2 | 12/2004 | Ishida | |
| 7,760,484 B2 | 7/2010 | Itakura et al. | |
| 2008/0100985 A1 | 5/2008 | Hattori | |
| 2010/0065300 A1 | 3/2010 | Miyashita et al. | |
| 2010/0326602 A1 | 12/2010 | Bluck et al. | |

FOREIGN PATENT DOCUMENTS

| | | |
|---|---|---|
| JP | 2002-329567 A | 11/2002 |
| JP | 2003-060018 A | 2/2003 |
| JP | 2003-151869 A | 5/2003 |
| JP | 2003-179127 A1 | 6/2003 |
| JP | 2006-332204 A | 12/2006 |
| JP | 2011-091361 A | 5/2011 |

* cited by examiner

| d1/d2 | 1.0 | 1.1 | 1.3 | 1.8 | 2.3 | 2.8 | 4.0 |
|---|---|---|---|---|---|---|---|
| PEEL/FLAKE | NO | NO | NO | NO | NO | NO | YES |
| CONTINUITY | × | ○ | ○ | ○ | ○ | ○ | × |

FIG. 8A

| DIAMETER | 0.2 | 0.5 | 1 | 1.5 | 2 | 2.5 | 3 | 3.5 |
|---|---|---|---|---|---|---|---|---|
| PEEL/FLAKE | NO | NO | NO | NO | NO | NO | NO | NO |
| CONTINUITY | ○ | ○ | ○ | ○ | ○ | ○ | ○ | × |

FIG. 8B

| t/d2 (ASPECT RATIO) | 1.4 | 1.5 | 2 | 5 | 10 | 15 | 20 | 30 |
|---|---|---|---|---|---|---|---|---|
| CONTINUITY | NO | YES | YES | YES | YES | YES | YES | NO |
| PASS/FAIL | × | ○ | ○ | ○ | ○ | ○ | ○ | × |

ELECTROSTATIC CHUCK

TECHNICAL FIELD

Embodiments of the invention relate to an electrostatic chuck, and more particularly to an electrostatic chuck capable of reliably ensuring the structure of externally extracting the electrode of a ceramic dielectric substrate.

BACKGROUND ART

A ceramic electrostatic chuck is fabricated by embedding an electrode between ceramic base materials of alumina or the like followed by sintering. By application of electrostatic clamping force to the incorporated electrode, the electrostatic chuck clamps a substrate such as a silicon wafer by electrostatic force. This type of electrostatic chuck has been put to practical use in the following configurations in order to supply electrostatic clamping force to the internal electrode. For instance, part of the conductor in electrical continuity with the electrode is exposed at the surface on the side opposite from the electrostatic clamping surface of the ceramic base material. Alternatively, a connector for power supply is joined to the electrode.

Patent Literature 1 discloses a structure of an electrostatic chuck including a connecting part (via) in electrical continuity with the internal electrode. In the electrostatic chuck described in Patent Literature 1, a conductive layer and an insulating film are sequentially laminated on a ceramic green sheet to form a laminated body. The laminated body is sintered to form a via in electrical continuity with the conductive layer (electrode).

However, the connecting part (via) having a smaller outer diameter is more susceptible to sintering shrinkage when sintering the ceramic. This tends to cause delamination of the metal material between the internal electrode of the ceramic base material and the connecting part (via). Furthermore, when sintering the ceramic, the metal material composing the connecting member may migrate in the ceramic base material to form a void due to surface tension of the metal material, or the electrode may be broken due to the thermal expansion difference between ceramic and metal. In particular, miniaturization of the outer diameter of the connecting member aggravates such problems and causes the problem of the decrease in reliability of the electrostatic chuck.

CITATION LIST

Patent Literature

[PTL1]
JP S62-264638 A (Kokai)

SUMMARY OF INVENTION

Technical Problem

This invention has been made based on the understanding of the aforementioned problems. An object of the invention is to provide an electrostatic chuck capable of achieving high reliability by reliable electrical continuity between the internal electrode and the connecting part.

Solution to Problem

According to an aspect of an embodiment of the invention, there is provided an electrostatic chuck including: a ceramic dielectric substrate having a first major surface for mounting an object to be clamped and a second major surface on opposite side from the first major surface; an electrode interposed between the first major surface and the second major surface of the ceramic dielectric substrate; and a connecting part connected to the electrode on a side of the second major surface of the electrode in the ceramic dielectric substrate and including a first region in contact with the electrode, with a first direction being defined as a direction from the first major surface toward the second major surface, and a second direction being defined as a direction orthogonal to the first direction, the first region being configured so that in a cross section of the electrode and the connecting part as viewed in the second direction, an angle on a side of the connecting part between an extension line along outer shape on the side of second major surface of the electrode and a tangential line of outer shape of the connecting part gradually increases in the first direction.

BRIEF DESCRIPTION OF DRAWINGS

FIG. 8A and FIG. 8B show experimental results for the junction state and electrical continuity state between the connecting part and the electrode.

DESCRIPTION OF EMBODIMENT

Figure 1:
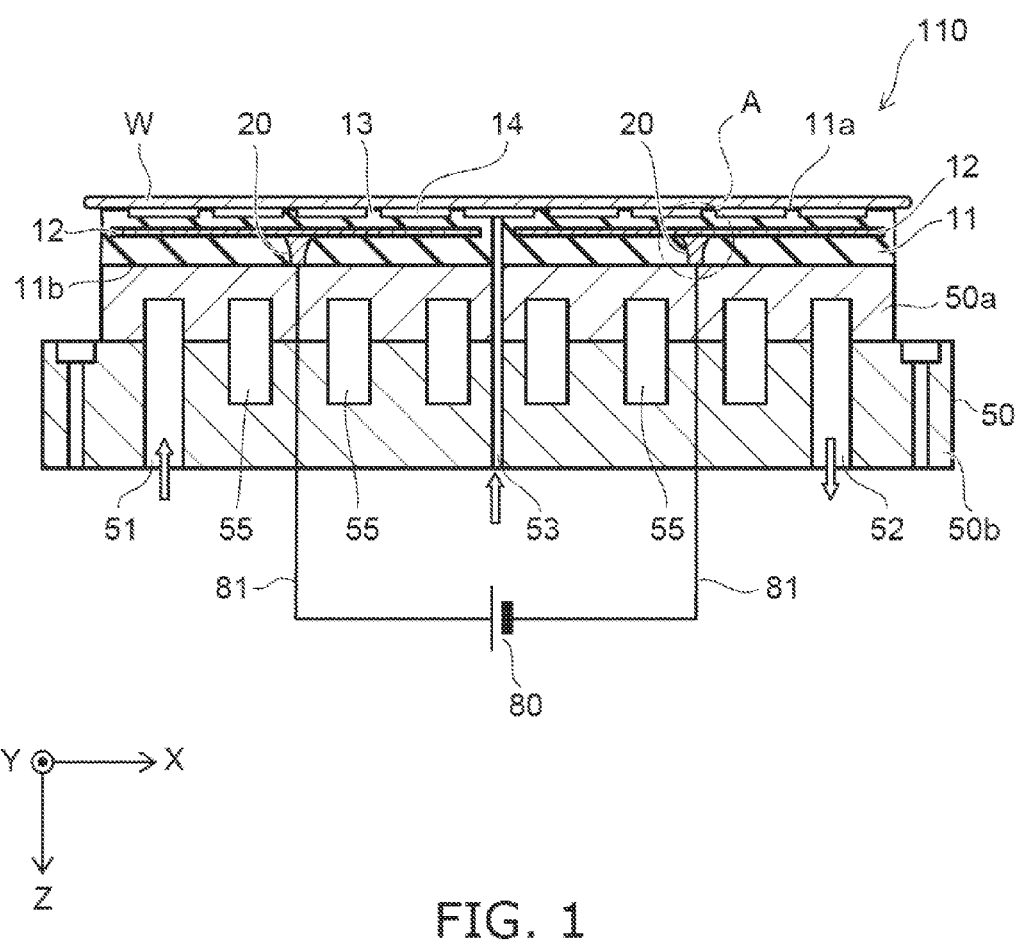
FIG. 1 is a schematic sectional view illustrating the configuration of an electrostatic chuck according to this embodiment.

A first aspect of the invention is an electrostatic chuck comprising: a ceramic dielectric substrate having a first major surface for mounting an object to be clamped and a second major surface on opposite side from the first major surface; an electrode interposed between the first major surface and the second major surface of the ceramic dielectric substrate; and a connecting part connected to the electrode on the second major surface side of the electrode in the ceramic dielectric substrate and including a first region in contact with the electrode, with a first direction being defined as a direction from the first major surface toward the second major surface, and a second direction being defined as a direction orthogonal to the first direction, the first region being configured so that in a cross section of the electrode and the connecting part as viewed in the second direction, an angle on the connecting part side between an extension line along outer shape on the second major surface side of the electrode and a tangential line of outer shape of the connecting part gradually increases in the first direction.

In this electrostatic chuck, the angle on the connecting part side between the extension line along the outer shape on the second major surface side of the electrode and the tangential line of the outer shape of the connecting part gradually increases in the first direction from the first major surface toward the second major surface. Thus, the contact area between the electrode and the connecting part is made larger than that in the case where the diameter of the connecting part is constant in the first direction. This can improve tight contact between the connecting part and the ceramic dielectric substrate while ensuring reliable electrical continuity. Furthermore, the outer shape of the connecting part is curved in the cross section as viewed in the second direction. This suppresses the occurrence of a corner being likely to act as an origin of electrical discharge under voltage application.

A second aspect of the invention is an electrostatic chuck according to the first aspect of the invention, wherein in the cross section of the electrode and the connecting part as viewed in the second direction orthogonal to the first direction, the angle on the connecting part side between the extension line along the outer shape on the second major surface side of the electrode and the tangential line of the outer shape of the connecting part in the first region is an acute angle.

This electrostatic chuck can improve contact between the electrode and the connecting part. This can suppress delamination between the electrode and the connecting part.

A third aspect of the invention is an electrostatic chuck according to the second aspect of the invention, wherein the ceramic dielectric substrate includes a portion being convex in the first direction at a position overlapping the connecting part as viewed in the first direction on a side connected to the electrode.

In this electrostatic chuck, the ceramic dielectric substrate includes a convex portion on the side connected to the electrode. Thus, the metal material of the connecting part and the electrode is made likely to migrate following the convex shape of this portion. This improves connection reliability between the electrode and the connecting part. Furthermore, the thickness of the ceramic dielectric substrate on the connecting part can be made thicker. Thus, warpage of the ceramic dielectric substrate on the connecting part is suppressed when polishing the surface of the ceramic dielectric substrate. This improves flatness achieved by polishing, and suppresses the occurrence of abnormal protrusions on the connecting part.

A fourth aspect of the invention is an electrostatic chuck according to the second aspect of the invention, wherein the connecting part includes a second region provided between the first region and the second major surface and having a diameter gradually increasing in the first direction.

In this electrostatic chuck, the connecting part includes a second region having a diameter gradually increasing in the first direction from the first major surface toward the second major surface. This improves connectivity of the connecting part with a conductive member such as a pad electrode connected to the side opposite from the electrode.

A fifth aspect of the invention is an electrostatic chuck according to one of the first to fourth aspects of the invention, wherein the ceramic dielectric substrate includes a recess extending from the second major surface to the connecting part, and the chuck further comprises a conductive member in electrical continuity with the connecting part exposed at a bottom surface of the recess.

This electrostatic chuck improves connectivity between the connecting part and the conductive member such as a pad electrode, and enables reliable electrical connection to an external electrode terminal.

A sixth aspect of the invention is an electrostatic chuck according to the fifth aspect of the invention, wherein the bottom surface has a curved surface.

This electrostatic chuck improves connectivity between the connecting part and the conductive member such as a pad electrode, and enables reliable electrical connection to an external electrode terminal (such as a probe).

A seventh aspect of the invention is an electrostatic chuck according to the first aspect of the invention, wherein material of the connecting part includes same kind of metal as material of the electrode.

This electrostatic chuck improves diffusivity of the electrode material when sintering the ceramic dielectric substrate. This enables integral sintering including the electrode and the connecting part.

An eighth aspect of the invention is an electrostatic chuck according to the seventh aspect of the invention, wherein the material of the connecting part includes same kind of material as material of the ceramic dielectric substrate.

This electrostatic chuck improves tight contact between the connecting part and the ceramic dielectric substrate when sintering the ceramic dielectric substrate. This enables integral sintering including the electrode and the connecting part.

A ninth aspect of the invention is an electrostatic chuck according to the fifth aspect of the invention, wherein area of the bottom surface as viewed in a direction opposite from the first direction is larger than area of the connecting part exposed at the bottom surface as viewed in the direction opposite from the first direction.

In this electrostatic chuck, the area of the bottom surface of the recess is larger than the area of the connecting part exposed at the bottom surface. Thus, it is easy to ensure electrical continuity with an external electrode terminal (such as a probe). This eliminates the need to bring the external electrode terminal into direct contact with the connecting part. Thus, damage to the connecting part can be suppressed.

A tenth aspect of the invention is an electrostatic chuck according to the fifth aspect of the invention, comprising a plurality of the connecting parts, wherein the plurality of connecting parts are provided in one of the recesses.

This electrostatic chuck enables more reliable electrical continuity between the electrode and the connecting part.

Embodiments of the invention will now be described with reference to the drawings. In the drawings, similar components are labeled with like reference numerals, and the detailed description thereof is omitted appropriately.

FIG. 1 is a schematic sectional view illustrating the configuration of an electrostatic chuck according to this embodiment.

Figure 2:
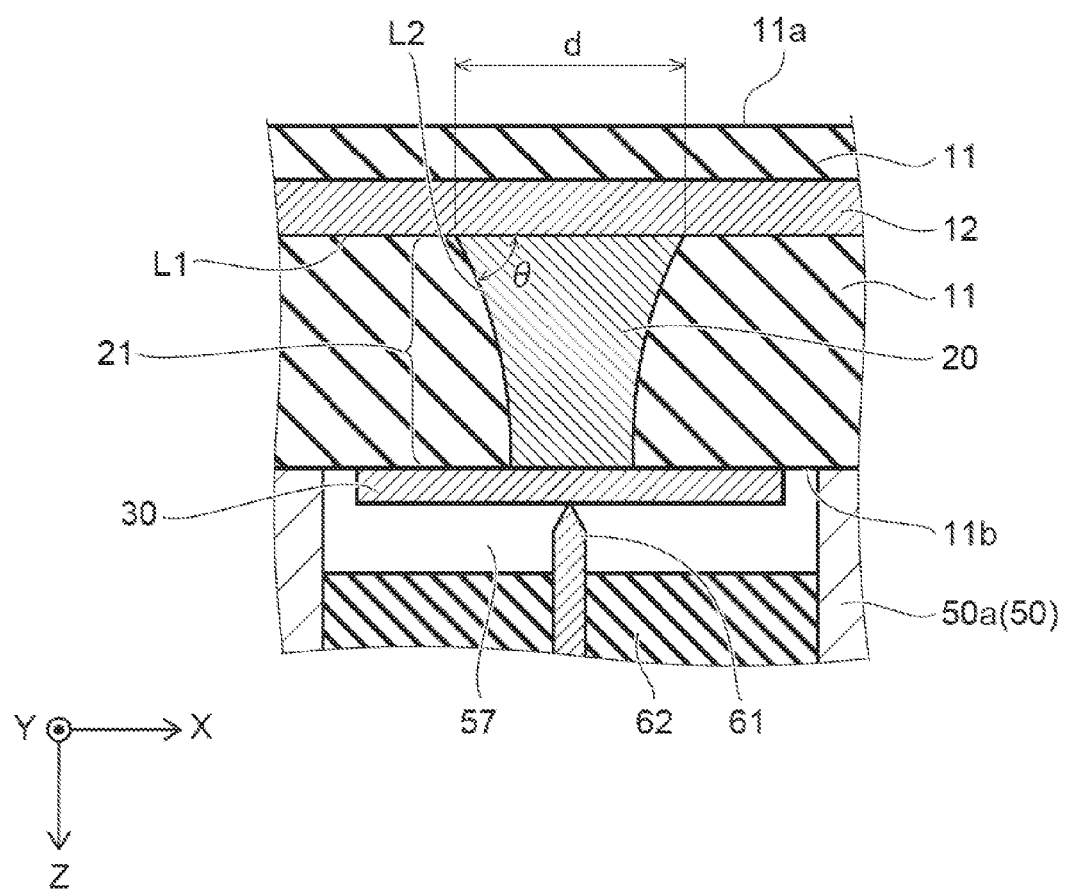
FIG. 2 is a schematic enlarged sectional view of part A shown in FIG. 1.

FIG. 2 is a schematic enlarged sectional view of part A shown in FIG. 1.

As shown in FIG. 1, the electrostatic chuck 110 according to this embodiment includes a ceramic dielectric substrate 11, an electrode 12, and a connecting part 20.

The ceramic dielectric substrate 11 is e.g. a flat plate-like base material made of sintered ceramic. The ceramic dielectric substrate 11 has a first major surface 11a for mounting an object to be clamped W such as a semiconductor substrate and a second major surface 11b on the side opposite from the first major surface 11a. The electrode 12 is interposed between the first major surface 11a and the second major surface 11b of the ceramic dielectric substrate 11. That is, the electrode 12 is formed so as to be inserted in the ceramic dielectric substrate 11. By application of a clamping voltage 80 to this electrode 12, the electrostatic chuck 110 generates charge on the first major surface 11a side of the electrode 12 and clamps the object to be clamped W by electrostatic force.

Here, in the description of this embodiment, the direction from the first major surface 11a toward the second major surface 11b (first direction) is referred to as Z-direction. One of the directions orthogonal to the Z-direction (second direction) is referred to as Y-direction. The direction orthogonal to the Z-direction and the Y-direction (third direction) is referred to as X-direction.

The electrode 12 is provided like a thin film along the first major surface ha and the second major surface 11b of the ceramic dielectric substrate 11. The electrode 12 is a clamping electrode for clamping the clamped object W. The electrode 12 may be of the unipolar type or the bipolar type. The electrode 12 shown in FIG. 1 is of the bipolar type, with two electrodes 12 provided on the same plane. The electrode 12 is not limited to being incorporated in the ceramic dielectric substrate 11, but may be such that a dielectric is fixed to a base plate with an adhesive or by brazing or the like.

The electrode 12 is provided with a connecting part 20 extending to the second major surface 1ib side of the ceramic dielectric substrate 11. The connecting part 20 is a via (solid type) or via hole (hollow type) in electrical continuity with the electrode 12.

As shown in FIG. 2, the connecting part 20 includes a first region 21 connected to the electrode 12. The outer diameter d of the shape (e.g., generally circular shape) of the first region 21 as viewed in the Z-direction gradually decreases in the Z-direction. The first region 21 is provided in at least part of the connecting part 20. In the example shown in FIG. 2, the entirety of the connecting part 20 is the first region 21.

Thus, the outer diameter d of the first region 21 provided in the connecting part 20 gradually decreases in the Z-direction. Accordingly, the contact area between the electrode 12 and the connecting part 20 can be made larger than that in the case where the outer diameter d of the connecting part 20 is constant in the Z-direction. This can improve tight contact between the connecting part 20 and the ceramic dielectric substrate 11 while ensuring reliable electrical continuity between the electrode 12 and the connecting part 20.

Here, a specific configuration example of the electrostatic chuck 110 is described.

As shown in FIG. 1, the electrostatic chuck 110 is attached onto a base plate 50. The base plate 50 serves as a reference for attaching the electrostatic chuck 110. The electrostatic chuck 110 is attached to the base plate 50 by using silicone or other heat-resistant resin, indium bonding, brazing or the like, which is suitably selected from the viewpoint of operating temperature range, cost and the like.

The base plate 50 is e.g. divided into an upper part 50a and a lower part 50b made of aluminum. A communication path 55 is provided between the upper part 50a and the lower part 50b. One end of the communication path 55 is connected to an input path 51, and the other end is connected to an output path 52.

The base plate 50 also serves to adjust the temperature of the electrostatic chuck 110. For instance, in the case of cooling the electrostatic chuck 110, a cooling medium is caused to flow in from the input path 51, to pass through the communication path 55, and to flow out from the output path 52. This can absorb heat from the base plate 50 by the cooling medium to cool the electrostatic chuck 110 attached onto the base plate 50. On the other hand, in the case of keeping warm the electrostatic chuck 110, a heat-retaining medium can be put into the communication path 55. Alternatively, a heating element can be incorporated in the electrostatic chuck 110 or the base plate 50. Thus, the temperature of the electrostatic chuck 110 is adjusted via the base plate 50. This can adjust the temperature of the clamped object W clamped by the electrostatic chuck 110.

Furthermore, dots 13 are provided as necessary on the first major surface 11a side of the ceramic dielectric substrate 11. Grooves 14 are provided between the dots 13. The grooves 14 communicate with each other, and a space is formed between the back surface of the clamped object W mounted on the electrostatic chuck 110 and the grooves 14. The grooves 14 are connected with an introduction path 53 penetrating through the base plate 50 and the ceramic dielectric substrate 11. A transfer gas such as helium (He) is introduced from the introduction path 53 while clamping the clamped object W. Then, the transfer gas flows in the space provided between the clamped object W and the grooves 14 so that the clamped object W can be directly cooled by the transfer gas.

Here, the height of the dots 13 (the depth of the grooves 14), the area ratio between the dots 13 and the grooves 14, the shapes thereof and the like can be appropriately selected to control the temperature of the clamped object W and particles attached to the clamped object W in a preferable state.

As shown in FIG. 2, a conductive member 30 may be provided on the second major surface 1ib of the ceramic dielectric substrate 11. The conductive member 30 is a pad in electrical continuity with the connecting part 20. A contact electrode 61 is provided on the upper part 50a of the base plate 50 corresponding to the position of the conductive member 30. A hole 57 is provided in the upper part 50a of the base plate 50. The contact electrode 61 held by an insulating material 62 is attached to this hole 57. Thus, when the electrostatic chuck 110 is attached to the upper part 50a of the base plate 50, the contact electrode 61 is brought into contact with the conductive member 30. Accordingly, the contact electrode 61 and the electrode 12 are brought into electrical continuity through the connecting part 20. This increases the region enabling electrical continuity even if the position of the contact electrode 61 is displaced. As a result, stable electrical continuity can be obtained.

The contact electrode 61 is e.g. a movable probe. This ensures contact between the contact electrode 61 and the conductive member 30, and minimally suppresses damage to the conductive member 30 due to the contact with the contact electrode 61. Here, the contact electrode 61 is not limited to that described above. The contact electrode 61 may have any configuration, such as simple contact with the conductive member 30 and connection with the conductive member 30 by fitting or screwing.

In the case where the conductive member 30 is not provided, the contact electrode 61 is brought into direct contact with the exposed surface on the second major surface 1ib side of the connecting part 20.

Next, the connecting part 20 is described in detail. The connecting part 20 shown in FIG. 2 is provided so as to penetrate in the Z-direction through the ceramic dielectric substrate 11 on the second major surface 11b side of the electrode 12. The connecting part 20 has a shape close to a truncated cone extending in the Z-direction.

Such a shape expands the contact area between the connecting part 20 and the electrode 12. This can ensure reliable junction and electrical continuity at the interface between the connecting part 20 and the electrode 12.

Figure 3:
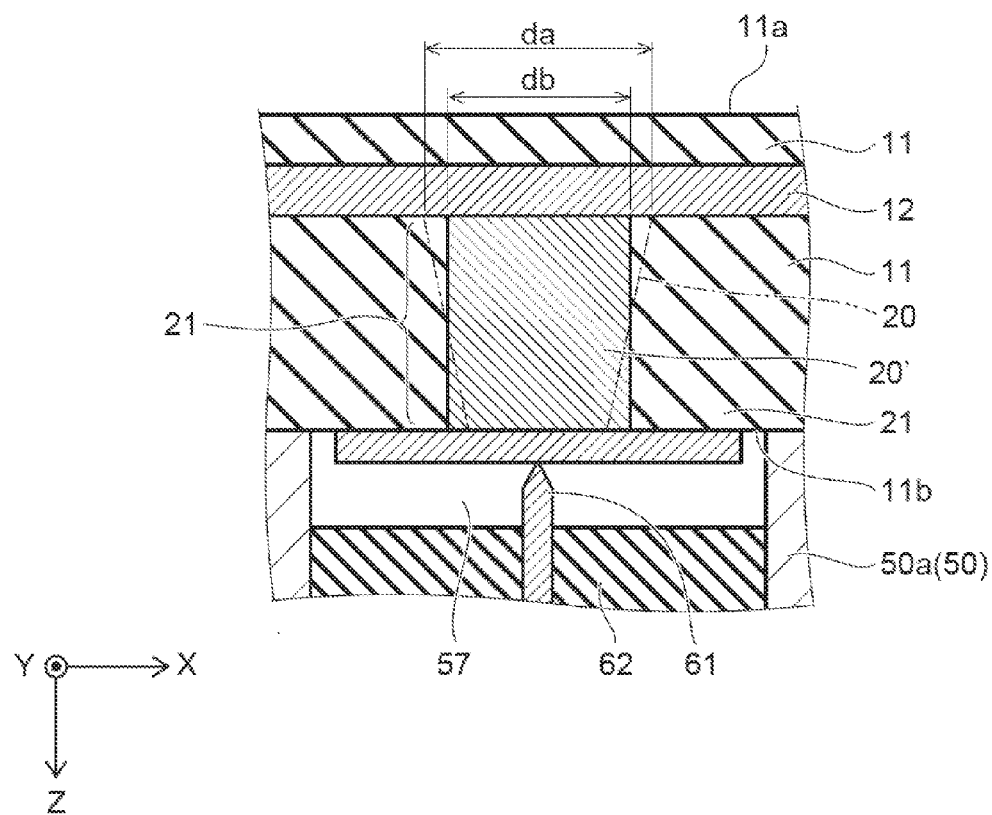
FIG. 3 is a schematic sectional view describing a reference example.

FIG. 3 is a schematic sectional view describing a reference example.

The connecting part 20' shown in FIG. 3 has an outer diameter being constant in the Z-direction. For instance, the outer diameter averaged in the Z-direction of the connecting part 20' may be equal to the outer diameter averaged in the Z-direction of the connecting part 20 shown in FIG. 2. Then, the outer diameter da of the contact surface between the connecting part 20 and the electrode 12 is larger than the outer diameter db of the contact surface between the connecting part 20' and the electrode 12. That is, the contact area between the connecting part 20 and the electrode 12 is larger than the contact area between the connecting part 20' and the electrode 12. Thus, the connectivity between the connecting part 20 and the electrode 12 is made higher than the connectivity between the connecting part 20' and the electrode 12.

Furthermore, in the connecting part 20, in the cross section of the electrode 12 and the connecting part 20 as viewed in e.g. the Y-direction orthogonal to the Z-direction, the angle θ on the connecting part 20 side between the extension line L1 along the outer shape on the second major surface side of the electrode 12 and the tangential line L2 of the outer shape of the connecting part 20 in the first region 21 is an acute angle. The angle θ is more than 0° and less than 90°.

If the angle θ is an acute angle, capillarity and surface tension of the electrode 12 help contact between the electrode material of the connecting part 20 and the electrode 12. Thus, contact between the electrode 12 and the connecting part 20 can be dramatically improved. This can suppress delamination between the electrode 12 and the connecting part 20 when sintering the ceramic dielectric substrate 11.

Here, if the connecting part 20 is shaped like a truncated cone, the gradient of the tangential line L2 is equal at any position on the outer shape of the connecting part 20 in the sectional view of the first region 21. On the other hand, if the outer shape of the connecting part 20 is curved in the sectional view of the first region 21, the gradient of the tangential line L2 is changed with the position on the outer shape of the connecting part 20 in the sectional view of the first region 21.

Figure 4:
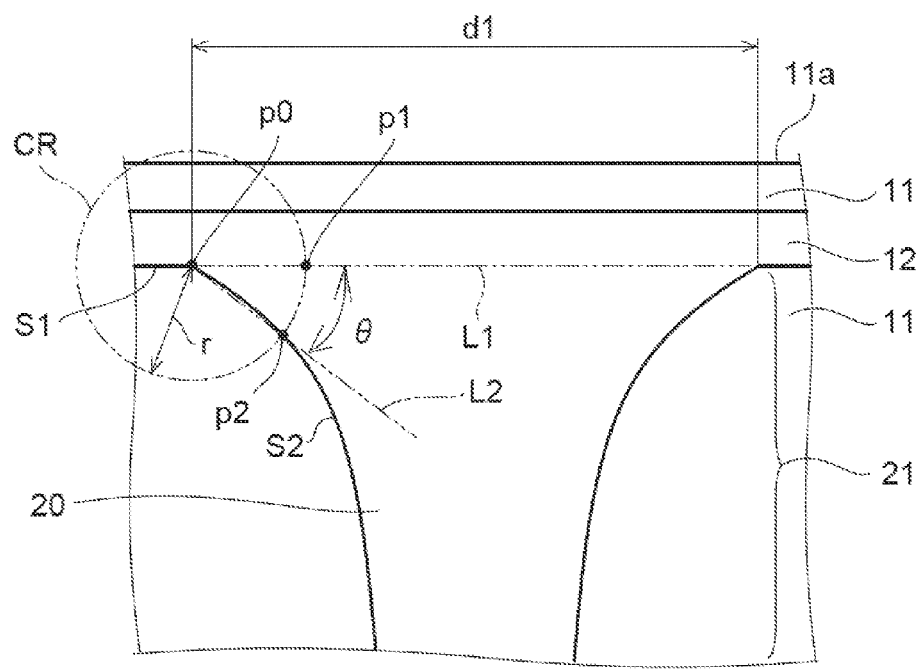
FIG. 4 is a schematic view describing an example of the definition of the angle θ.
Figure 4:
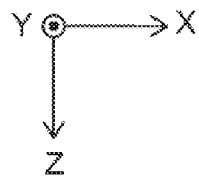

FIG. 4 is a schematic view describing an example of the definition of the angle θ.

FIG. 4 shows an example of the definition of the angle θ in the case where the outer shape of the connecting part 20 is curved in the sectional view of the first region 21.

Here, the sectional view refers to a cross section in the XZ-plane passing through the center of the connecting part 20 as viewed in the Y-direction. An example of the definition of the angle θ is as follows.

In sectional view, the intersection point of the outline S1 on the second major surface 11b of the electrode 12 and the outline S2 of the connecting part 20 is denoted as intersection point p0.

The outer diameter (length in the X-direction) of the connecting part 20 at the contact surface with the electrode 12 is denoted as outer diameter d1.

A circle CR with radius r is drawn with the center at the intersection point p0. The intersection point of the circle CR and the extension line L1 is denoted as intersection point p1. The intersection point of the circle CR and the outline S2 is denoted as intersection point p2.

The angle (the narrower angle) between the line connecting the intersection point p1 with the intersection point p0 and the line connecting the intersection point p2 with the intersection point p0 is denoted as angle θ.

Here, the radius r of the circle CR is e.g. ⅛ of the outer diameter d1.

The angle θ can be measured by cross-sectional observation of the connecting part 20. For instance, a cross section in the XZ-plane passing through the center of the connecting part 20 is polished, and the polished surface is measured in accordance with the aforementioned definition. Polishing of the cross section is preferably polishing with less influence on the electrode 12 and the connecting part 20 (e.g., polishing using ion beams and the like (Cross section polisher® available from JEOL Ltd.)). The angle θ can be accurately measured by such polishing without ductile deformation of the electrode 12.

Thus, in the case where the outer shape of the connecting part 20 is curved in the sectional view of the first region 21, the outer circumferential length of the connecting part 20 is longer than in the case of linear (tapered) outer shape. Accordingly, the current density under voltage application can be reduced.

Furthermore, in the case where the outer shape of the connecting part 20 is curved in the sectional view of the first region 21, occurrence of a corner on the outer shape of the connecting part 20 can be suppressed. For instance, in a shape (generally horn-like shape) such that the angle θ gradually increases in the Z-direction (the increase rate of the outer diameter of the connecting part 20 gradually increases toward the electrode 12), a corner (e.g., cusp) is less likely to be formed on the outer shape of the connecting part 20. A corner on the connecting part 20 is likely to act as an origin of electrical discharge under voltage application. Acting as an origin of electrical discharge may cause failure of electrical continuity in the connecting part 20 and the electrode 12. Smooth connection of the connecting part 20 to the electrode 12 suppresses the occurrence of corners and improves the reliability of electrical continuity.

Figure 5:
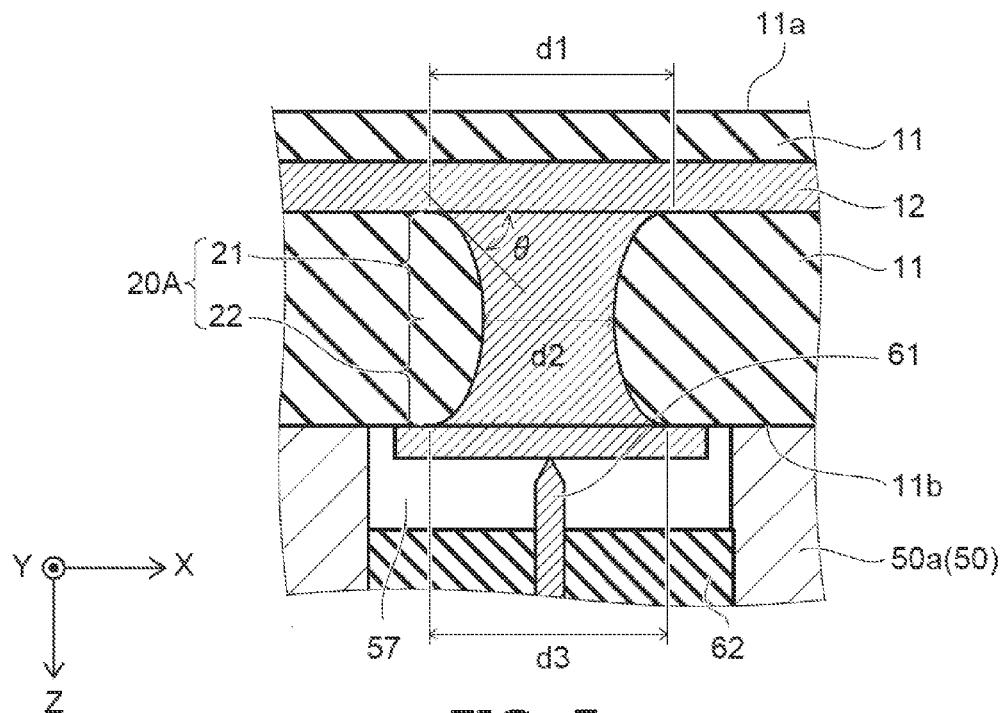
FIG. 5 is a schematic sectional view illustrating an alternative connection configuration of the connecting part.

FIG. 5 is a schematic sectional view illustrating an alternative connection configuration of the connecting part.

FIG. 5 shows a schematic enlarged sectional view of part A shown in FIG. 1. The connecting part 20A shown in FIG. 5 includes a first region 21 and a second region 22. The outer diameter of the shape of the first region 21 as viewed in the Z-direction gradually decreases in the Z-direction. For instance, the outer diameter of the first region 21 is the largest on the electrode 12 side (outer diameter d1), and gradually decreases from the electrode 12 in the Z-direction. The smallest outer diameter is outer diameter d2.

The second region 22 is provided between the first region 21 and the second major surface 11b. The outer diameter of the shape of the second region 22 as viewed in the Z-direction gradually increases in the Z-direction. For instance, the outer diameter of the second region 22 is the smallest on the first region 21 side (outer diameter d2), and gradually increases in the Z-direction. The largest outer diameter is outer diameter d3 on the second major surface 11b side. By the first region 21 and the second region 22, the connecting part 20A has a curved shape being wide on the electrode 12 side and the second major surface 11b side, and narrow in the central part.

A conductive member 30 connected to the second region 22 is provided on the second major surface 11b of the ceramic dielectric substrate 11. A contact electrode 61 provided on the upper part 50a of the base plate 50 is in contact with the conductive member 30.

In this type of connecting part 20A, the contact area with the electrode 12 can be expanded by the first region 21. Furthermore, the contact area with the conductive member 30 can also be expanded by the second region 21.

For instance, compared with the connecting part 20' shown in FIG. 3, the outer diameter averaged in the Z-direction of the connecting part 20' may be equal to the outer diameter averaged in the Z-direction of the connecting part 20A shown in FIG. 5. Then, the contact area between the connecting part 20A and the electrode 12 is larger than the contact area between the connecting part 20' and the electrode 12. Furthermore, the contact area between the connecting part 20A and the conductive member 30 is larger than the contact area between the connecting part 20' and the conductive member 30.

In this type of connecting part 20A, the connectivity between the connecting part 20A and the electrode 12 is made higher than the connectivity between the connecting part 20' and the electrode 12. Furthermore, the connectivity between the connecting part 20A and the conductive member 30 is made higher than the connectivity between the connecting part 20' and the conductive member 30.

Thus, in the connecting part 20A, the connectivity with both the electrode 12 and the conductive member 30 is improved.

In the connecting part 20A shown in FIG. 5, the first region 21 and the second region 22 are adjacent. However, another region (e.g., a region having an outer diameter equal in the Z-direction) may be interposed between the first region 21 and the second region 22.

Figure 6:
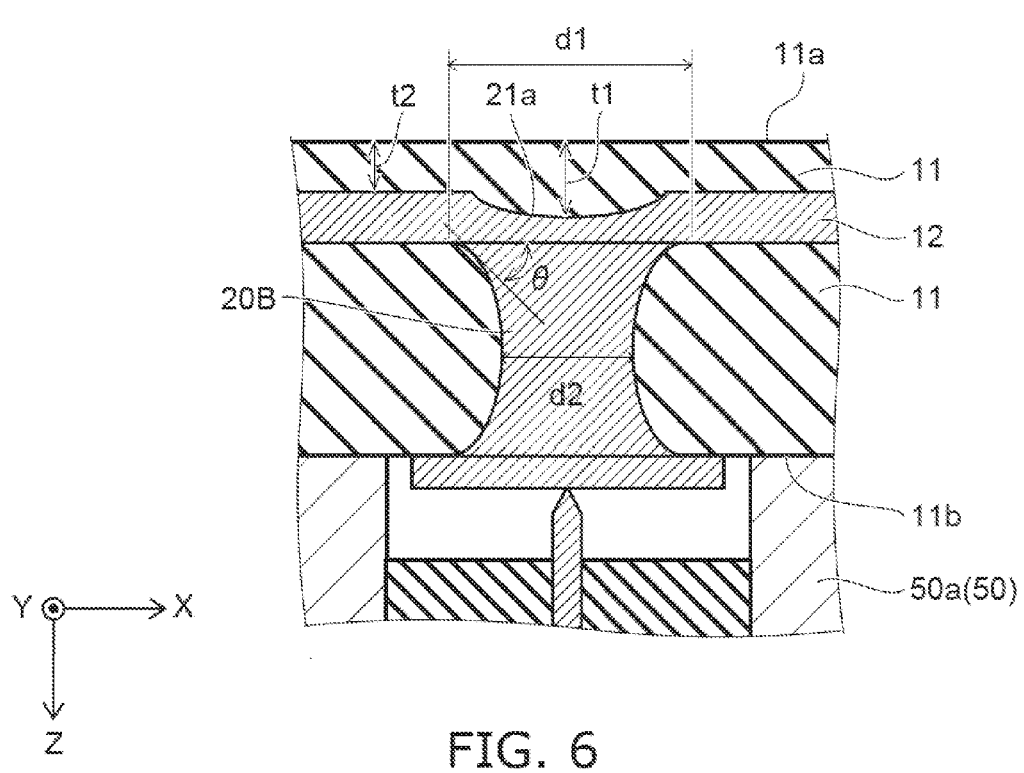
FIG. 6 is a schematic sectional view illustrating an alternative connection configuration.

FIG. 6 is a schematic sectional view illustrating an alternative connection configuration.

FIG. 6 shows a schematic enlarged sectional view of part A shown in FIG. 1. In the connecting part 20B shown in FIG. 6, the ceramic dielectric substrate 11 includes a portion 21a being convex in the Z-direction. The portion 21a is convex in the Z-direction at the contact surface of the ceramic dielectric substrate 11 with the electrode 12 at the position overlapping the connecting part 20B as viewed in the Z-direction. The portion 21a is provided so as to be convex in the Z-direction at e.g. a position corresponding to the central region of the connecting part 20B as viewed in the Z-direction.

In the portion 21a, the thickness t1 in the Z-direction of the ceramic dielectric substrate 11 is thicker than the thickness t2 of the portion other than the portion 21a. The thickness t1 of the ceramic dielectric substrate 11 in the portion 21a is the thickest in the central portion (the portion corresponding to the center of the connecting part 20B), and gradually thinned from the central portion toward the periphery.

In this type of connecting part 20B, the metal material of the connecting part 20B and the electrode 12 is likely to migrate following the convex portion 21a. This improves connection reliability between the electrode 12 and the connecting part 20B. That is, when sintering the ceramic dielectric substrate 11, the metal material of the connecting part 20B and the electrode 12 migrates following the convex shape of the portion 21a. This suppresses delamination at the junction between the electrode 12 and the connecting part 20B.

Furthermore, the thickness t1 of the ceramic dielectric substrate 11 on the connecting part 20B can be made thicker than the thickness t2 of the ceramic dielectric substrate 11 outside the connecting part 20B. This suppresses warpage of the ceramic dielectric substrate 11 on the connecting part 20B when polishing the surface of the ceramic dielectric substrate 11.

More specifically, when polishing the surface of the ceramic dielectric substrate 11, warpage of the ceramic dielectric substrate 11 is likely to occur in the portion provided with the connecting part 20B. As shown in FIG. 6, if the ceramic dielectric substrate 11 is provided with the portion 21a, the thickness t1 of this portion 21a is thicker than the thickness t2. This increases the rigidity of the ceramic dielectric substrate 11. Thus, even under application of pressure when polishing the surface of the ceramic dielectric substrate 11, the ceramic dielectric substrate 11 is less likely to warp on the connecting part 20B. This enhances the flatness of the ceramic dielectric substrate 11.

Here, if warpage occurs in the ceramic dielectric substrate 11 when polishing the surface of the ceramic dielectric substrate 11, the polishing rate on the connecting part 20B decreases. This may produce a bulge (protrusion) at the surface of the ceramic dielectric substrate 11 after polishing. Such a bulge may be in contact with the clamped object W such as a wafer to cause temperature abnormality in the contact electrode 61. The convex portion 21a provided on the connecting part 20B enhances the flatness achieved by polishing. This can prevent the occurrence of temperature abnormality in the contact electrode 61.

Here, the connecting part 20B shown in FIG. 6 includes a second region 22. However, the second region 22 is not necessarily needed.

Figure 7A:
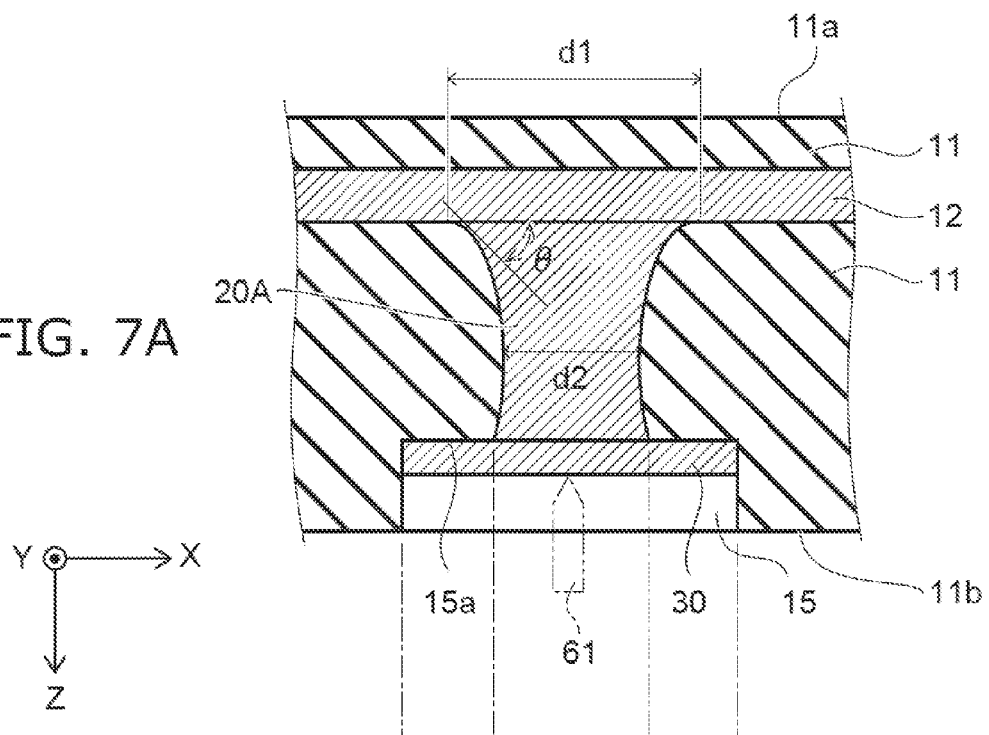
FIG. 7A and FIG. 7B are schematic views illustrating an alternative connection configuration.
Figure 7B:
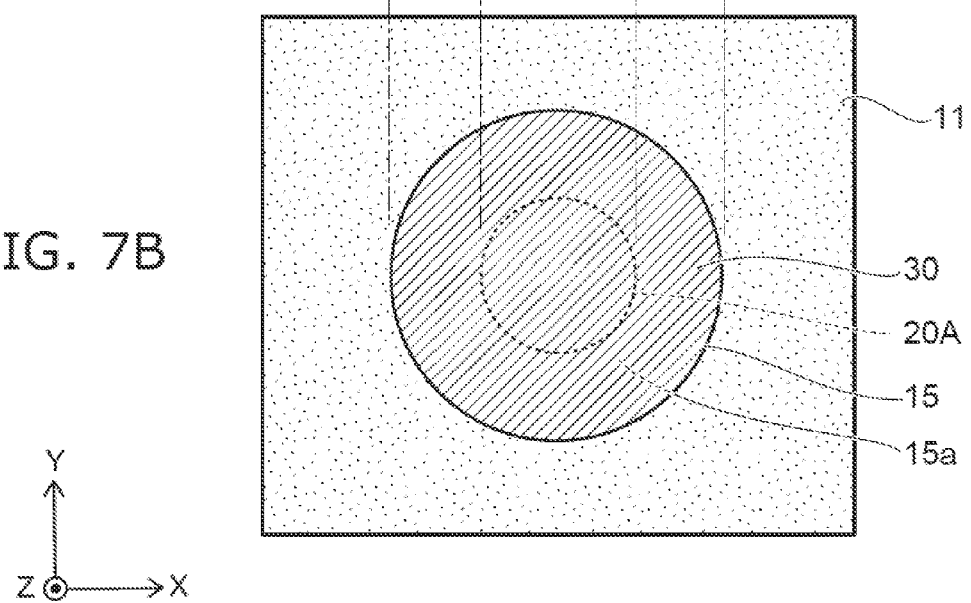

FIG. 7A and FIG. 7B are schematic views illustrating an alternative connection configuration.

FIG. 7A shows a schematic enlarged sectional view of part A shown in FIG. 1. FIG. 7B is a schematic plan view of the connecting part as viewed in the direction opposite from the Z-direction.

As shown in FIG. 7A, the ceramic dielectric substrate 11 includes a recess 15 extending from the second major surface 11b to the connecting part 20A.

As shown in FIG. 7B, the area of the outer shape at the bottom surface 15a of the recess 15 as viewed in the direction opposite from the Z-direction is larger than the area of the outer shape of the connecting part 20A exposed at the bottom surface 15a as viewed in the direction opposite from the Z-direction.

By providing such a recess 15, a conductive member 30 in electrical continuity with the connecting part 20A exposed through the bottom surface 15a can be reliably provided on the bottom surface 15a of the recess 15. For instance, the conductive member 30 may be provided throughout the entire surface of the bottom surface 15a of the recess 15. Furthermore, the conductive member 30 may be formed so as to be embedded in the recess 15. After the recess 15 is formed in the ceramic dielectric substrate 11, the material (e.g., metal paste material) of the conductive member 30 may be embedded in the recess 15. Then, the conductive member 30 can be formed at a prescribed position without protruding from the recess 15.

The area of the bottom surface 15a of the recess 15 is larger than the area of the connecting part 20A exposed at the bottom surface 15a. Thus, electrical continuity with an external contact electrode 61 can be provided through the conductive member 30 in the recess 15. This eliminates the need to bring the contact electrode 61 into direct contact with the connecting part 20A. Thus, damage to the connecting part 20A can be suppressed.

Here, FIG. 7A and FIG. 7B show the connecting part 20A. However, the embodiment is also applicable to the connecting part 20 shown in FIG. 2 and the connecting part 20B shown in FIG. 6.

FIG. 8A and FIG. 8B show experimental results for the junction state and electrical continuity state between the connecting part and the electrode.

FIG. 8A shows delamination (flaking) and the electrical continuity state between the connecting part 20 and the electrode 12 with respect to d1/d2. In FIG. 8A, the presence or absence of delamination (flaking) and the presence or absence of electrical continuity were examined for d1/d2 set to 1.0, 1.1, 1.3, 1.8, 2.3, 2.8, and 4.0. In the case of d1/d2 being 1.0, 1.1, 1.3, 1.8, 2.3, and 2.8, no delamination (flaking)

between the connecting part 20 and the electrode 12 occurred. In the case of d1/d2 being 4.0, delamination (flaking) between the connecting part 20 and the electrode 12 occurred. In the case of d1/d2 being 1.1, 1.3, 1.8, 2.3, and 2.8, electrical continuity between the connecting part 20 and the electrode 12 was favorable. In the case of d1/d2 being 1.0 and 4.0, electrical continuity between the connecting part 20 and the electrode 12 was defective.

FIG. 8B shows delamination (flaking) and the electrical continuity state between the connecting part 20 and the electrode 12 with respect to the outer diameter d2. In FIG. 8B, the presence or absence of delamination (flaking) and the presence or absence of electrical continuity were examined for the outer diameter d2 set to 0.2 millimeters (mm), 0.5 mm, 1 mm, 1.5 mm, 2 mm, 2.5 mm, 3 mm, and 3.5 mm. For any value of the outer diameter d2 described above, no delamination (flaking) between the connecting part 20 and the electrode 12 occurred.

In the case of the outer diameter d2 being 0.2 mm, 0.5 mm, 1 mm, 1.5 mm, 2 mm, 2.5 mm, and 3 mm, electrical continuity between the connecting part 20 and the electrode 12 was favorable. On the other hand, for the outer diameter d2 being 3.5 mm, electrical continuity between the connecting part 20 and the electrode 12 was defective.

From these experimental results, it has been found that d1/d2 is more than 1 and less than 4, and that a preferable outer diameter d2 is 0.1 mm or more and less than 3.5 mm.

The material of the connecting part 20 may include the same kind of material as the material of the electrode 12. The material of the electrode 12 includes a noble metal such as palladium (Pd) and platinum (Pt). The material of the connecting part 20 includes e.g. Pt. Besides Pt, the material of the connecting part 20 may include Pd, which is included in the material of the electrode 12.

This improves diffusivity of the material of the electrode 12 into the connecting part 20 when sintering the ceramic dielectric substrate 11. This enables integral sintering including the electrode 12 and the connecting part 20.

Furthermore, the material of the connecting part 20 may include the same kind of material as the material of the ceramic dielectric substrate 11. The material of the ceramic dielectric substrate 11 is e.g. alumina. The amount of impurity included in alumina is preferably small. The alumina purity is 99.9% or more, and more preferably 99.99% or more.

The material of the connecting part 20 includes e.g. alumina, which is included in the ceramic dielectric substrate 11. The proportion of alumina added to the connecting part 20 as a common material is e.g. 50% by volume or more and 70% by volume or less. The material of the electrode 12 may also be made identical to the material of the connecting part 20.

The electrostatic chuck 110 is formed by forming a green sheet made of e.g. alumina power added with a binder and the like, forming a laminated body of a plurality of green sheets, and sintering this laminated body.

The green sheet includes one in which a metallized paste constituting the electrode 12 is formed, and one in which a metallized paste constituting the connecting part 20 is formed.

The laminated body is formed by a sintering process including e.g. HIP processing. Thus, the electrostatic chuck 110 is completed. However, the method for manufacturing the electrostatic chuck 110 is not limited thereto.

This electrostatic chuck 110 improves tight contact between the connecting part 20 and the ceramic dielectric substrate 11 when sintering the ceramic dielectric substrate 11. This enables integral sintering including the electrode 12 and the connecting part 20.

FIG. 9A to FIG. 11B are schematic sectional views illustrating alternative connection configurations.

Figure 9A:
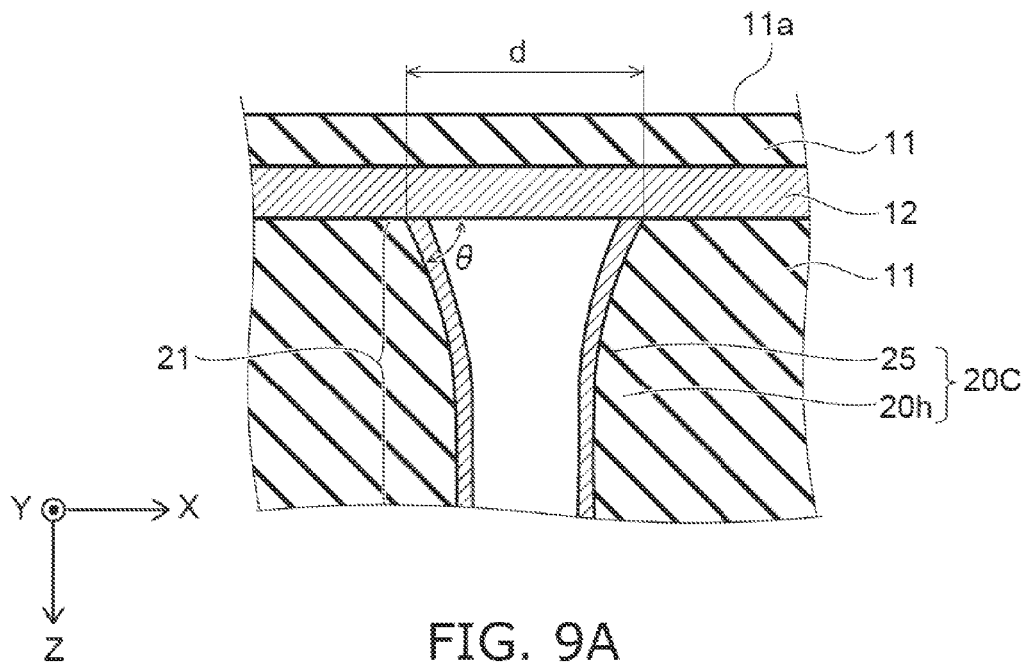
FIG. 9A to FIG. 9B are schematic sectional views illustrating alternative connection configurations.

The connecting part 20C shown in FIG. 9A is an example having a hollow structure. The ceramic dielectric substrate 11 includes a hole 20h on the second major surface 11b side of the electrode 12. A connecting part material film 25 is formed on the inner wall of this hole 20h. This constitutes a connecting part 20C having a hollow structure in which the central part of the hole 20h is left as a void.

This connecting part 20C also includes a first region 21 in which the outer diameter d of the shape as viewed in the Z-direction gradually decreases in the Z-direction. The angle θ is an acute angle also in the connecting part 20C.

Figure 9B:
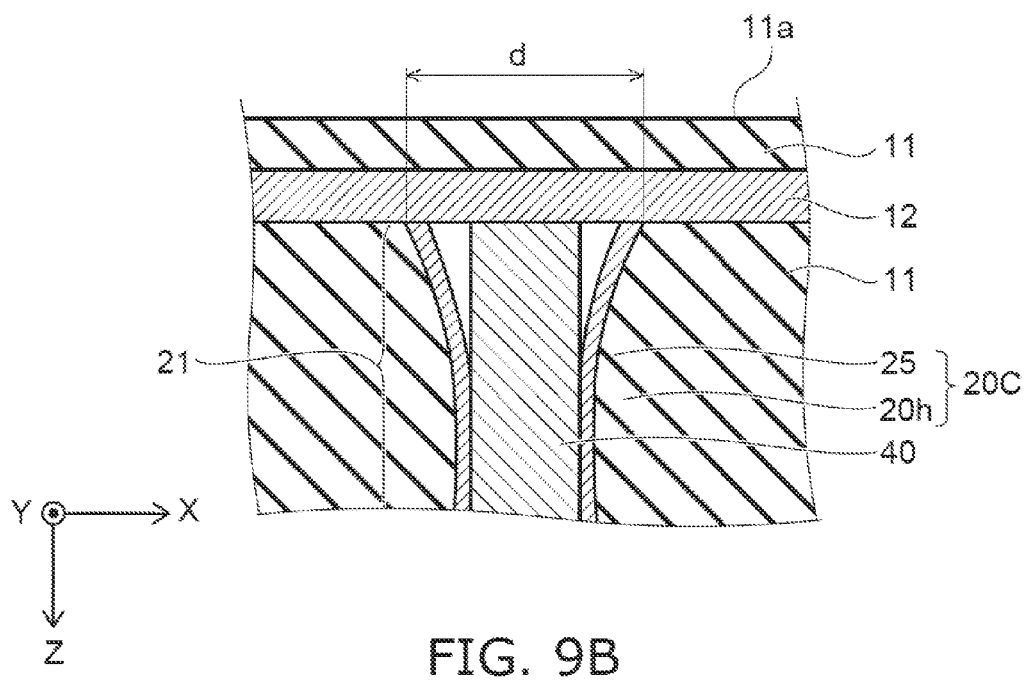

The example of the connection configuration shown in FIG. 9B has a structure in which an electrical continuity member 40 is inserted in the void of the connecting part 20C having the hollow structure shown in FIG. 9A. After forming the connecting part 20C having the hollow structure, an electrical continuity member 40 may be inserted in the void so that the electrical continuity member 40 is in electrical continuity with the connecting part material film 25 and the electrode 12.

Figure 10A:
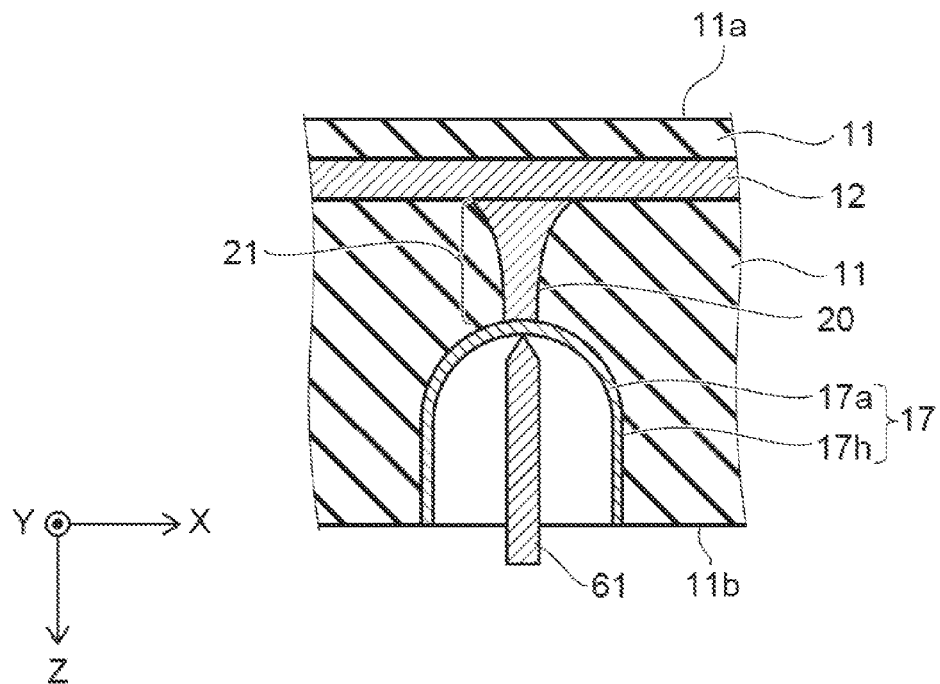
FIG. 10A to FIG. 10B are schematic sectional views illustrating alternative connection configurations.

In the example of the connection configuration shown in FIG. 10A, a contact part 17 is provided in the ceramic dielectric substrate 11. The contact part 17 includes a hole 17h (recess) extending from the second major surface 11b of the ceramic dielectric substrate 11 to the connecting part 20A, and a conductive film 17a provided on the inner wall of the hole 17h. The tip of the hole 17h (the bottom surface of the recess) has a curved surface. For instance, the tip of the hole 17h is shaped like a sphere. The connecting part 20 is exposed through the spherical tip and in contact with the conductive film 17a in this exposed portion.

The hole 17h is provided by using a drill or the like from the second major surface 11b side after sintering the ceramic dielectric substrate 11. For instance, a rotary grinding tool provided with a spherical bit at the tip is used to form a hole 17h extending from the second major surface 11b to the connecting part 20. Thus, a hole 17h having a spherical tip is formed.

The outer diameter of the connecting part 20 is changed along the Z-direction. Thus, the depth of the hole 17h can be grasped by the outer diameter of the connecting part 20 exposed through the tip of the hole 17h.

A conductive film 17a is formed on the inner wall of the hole 17h. The conductive film 17a may be made of platinum paste, or provided by plating, CVD (chemical vapor deposition), or organic resin including conductive particles.

In this contact part 17, an external contact electrode 61 is in contact with the conductive film 17a to provide external electrical continuity with the electrode 12.

Figure 10B:
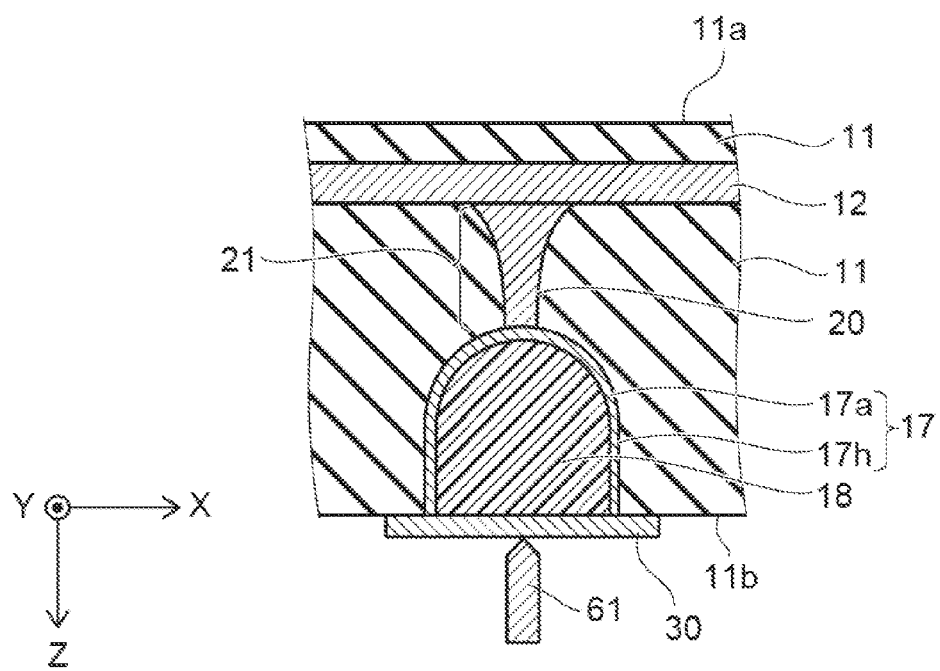

In the example of the connection configuration shown in FIG. 10B, a conductive material 18 is embedded in the contact part 17 shown in FIG. 10A. The conductive material 18 is based on e.g. conductive resin, brazing, or soldering. A conductive member 30 is provided via the conductive material 18 on the second major surface lib of the ceramic dielectric substrate 11. An external contact electrode 61 is in contact with this conductive member 30 to provide external electrical continuity with the electrode 12.

Figure 11A:
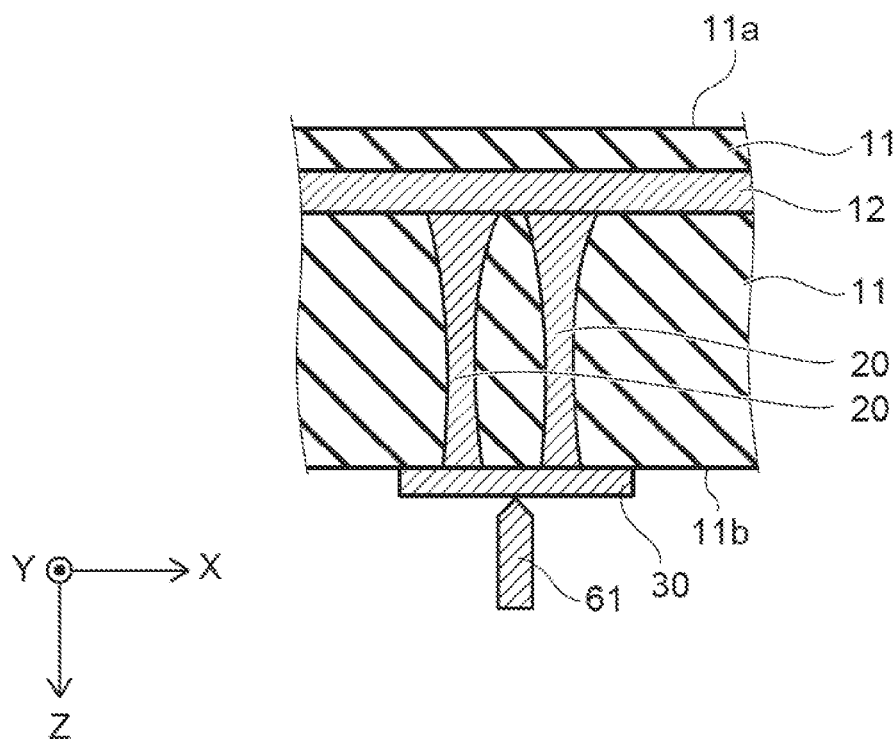
FIG. 11A to FIG. 11B are schematic sectional views illustrating alternative connection configurations.

The example of the connection configuration shown in FIG. 11A includes a plurality of connecting parts 20 and a conductive member 30. A plurality of connecting parts 20 are connected to one conductive member 30. For instance, a plurality of connecting parts 20 are arranged around the center of the conductive member 30 when the second major surface 11b is viewed in the direction opposite from the Z-direction.

Figure 11B:
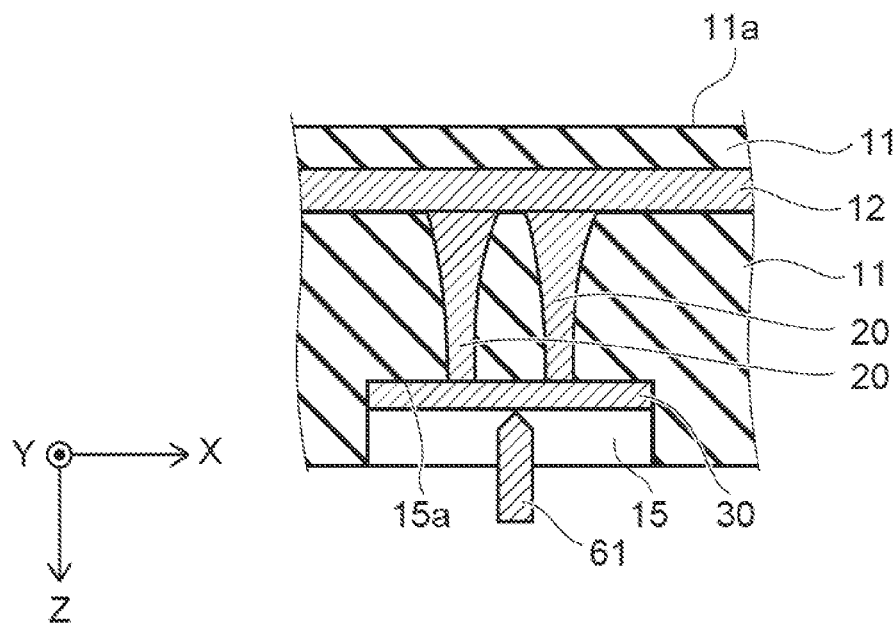

The example of the connection configuration shown in FIG. 11B includes a plurality of connecting parts 20, a recess 15 extending from the second major surface 11b of the ceramic dielectric substrate 11 to the plurality of connecting parts 20, and a conductive member 30 provided on the bottom surface 15a of the recess 15.

Also in this connection configuration, for instance, a plurality of connecting parts 20 are arranged around the center of the conductive member 30 when the second major surface 11b is viewed in the direction opposite from the Z-direction.

By providing the recess 15, a conductive member 30 can be reliably provided on the bottom surface 15a. Thus, electrical continuity between the electrode 12 and the connecting part 20 can be made more reliably.

Next, an example of the method for manufacturing the electrostatic chuck 110 is described.

Figure 12A:
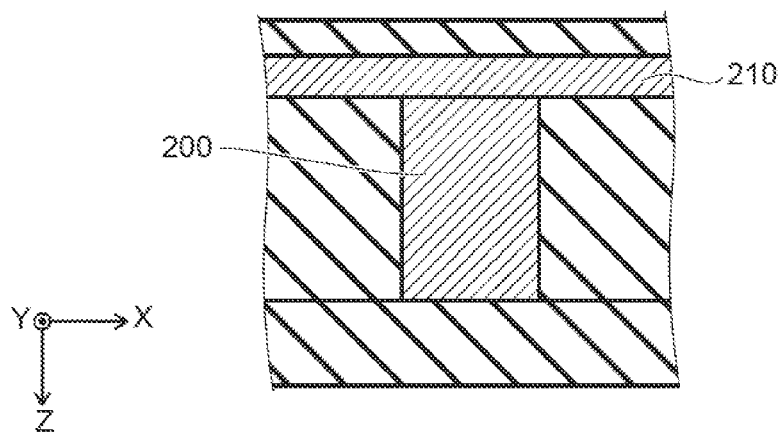
FIG. 12A to FIG. 12C are schematic sectional views illustrating the method for manufacturing an electrostatic chuck.
Figure 12B:
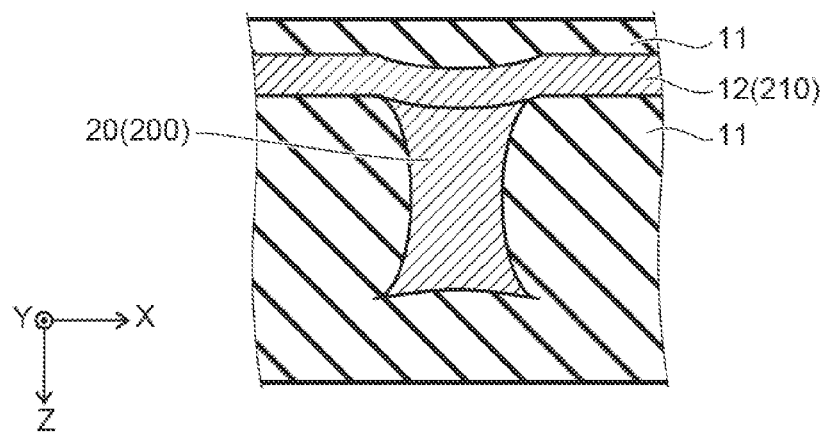
Figure 12C:
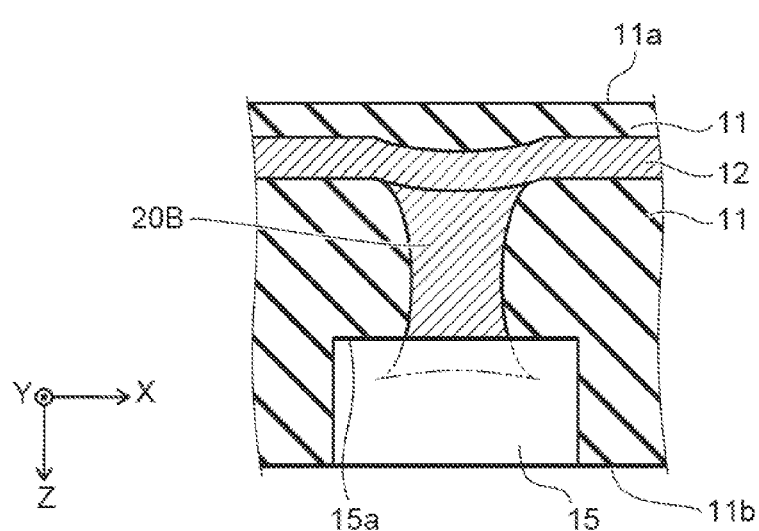

FIG. 12A to FIG. 12C are schematic sectional views illustrating the method for manufacturing an electrostatic chuck.

FIG. 12A to FIG. 12C primarily illustrate the procedure of forming the connecting part 20.

(Fabrication of Alumina Green Sheet)

First, an alumina green sheet is fabricated. More specifically, alumina powder is added with a binder, solvent and the like, and mixed and milled in a ball mill. Then, air bubbles are removed, and a green sheet is shaped. The amount of impurity included in the alumina powder is preferably small. The purity is 99.9% by weight or more, and more preferably 99.99% by weight or more. The binder can be at least one resin selected from the group consisting of vinyl resins such as polyvinyl alcohol, polyvinyl butyral, and polyvinyl chloride, cellulose resins such as methyl cellulose, ethyl cellulose, and hydroxyethyl cellulose, and acrylic resins such as polyacrylic ester and polymethyl methacrylate. Besides, the binder may be selected from aqueous binder resins or other commonly-used binders usable for the process of ceramic sheet products. The solvent can be selected from a single solvent such as methyl ethyl ketone, ethyl alcohol, isopropyl alcohol, toluene, diethyl ether, trichloroethylene, and methanol, or a mixed solvent of a plurality thereof. However, the solvent is not limited thereto as long as it can dissolve the binder.

(Preparation of Metallized Paste, Electrode Formation)

Next, as shown in FIG. 12A, a metallized paste 210 for forming an electrode 12 on the alumina green sheet is prepared. The metallized paste 210 is prepared as follows. A binder and the like are added to a mixture of alumina powder and Pd powder, and mixed by a triple roll mill to form a metallized paste 210.

Next, an internal electrode pattern constituting an electrode 12 is printed by screen printing technique using the aforementioned metallized paste 210 on the alumina green sheet. The formation of the electrode is not limited to the screen printing technique, but may be based on e.g. vapor deposition technique (such as PVD (physical vapor deposition) and CVD).

Furthermore, a through hole or via hole for forming e.g. a connecting part 20B is provided. The metallized paste 200 is embedded in the through hole or via hole.

(Lamination of Alumina Green Sheets)

Next, the alumina green sheets aligned with each other are laminated and thermocompressed into a laminated body with the total thickness set to a prescribed thickness.

(Sintering of Laminated Alumina Green Sheets, HIP Processing)

Next, the laminated body is sintered at 1250° C. or more and 1700° C. or less, and more preferably at 1300° C. or more and 1450° C. or less, simultaneously with the internal electrode pattern. The sintering is not limited in terms of the sintering atmosphere such as ambient atmosphere and reducing atmosphere. After sintering, HIP (hot isostatic pressing) processing is performed by further setting the temperature and pressure. A preferable condition of the HIP processing is such that the pressurizing gas (e.g., Ar) is set to approximately 1000 atm or more, and the temperature is set to 1200° C. or more and 1600° C. or less depending on the sintering temperature.

FIG. 12B illustrates the state of the laminated body e.g. after the HIP processing. The metallized paste 200 is subjected to pressure from the surroundings by the HIP processing. Thus, the central part of the upper surface, side surface, and lower surface of the connecting part 20 formed after the sintering is curved inward. Furthermore, the ceramic dielectric substrate 11 on the connecting part 20 is provided with a portion 21a being convex in the Z-direction.

(Formation of External Terminal)

Next, an external terminal is formed. More specifically, as shown in FIG. 12C, the ceramic dielectric substrate 11 is counterbored from the second major surface 11b side by using a drill or the like to expose the internal connecting part 20. With this counterboring, part of the lower side of the connecting part 20 is removed. An electrode terminal is bonded by using brazing, soldering, a conductive adhesive or the like to this counterbored portion.

(Processing of Ceramic Dielectric Substrate)

Both the front and back surfaces of the ceramic dielectric substrate 11 are ground to a desired thickness.

(Joining)

The ceramic dielectric substrate 11 with the electrode 12 formed thereon is joined to a base plate 50.

(Fabrication of Surface Pattern)

The ceramic dielectric substrate 11 joined to the base plate 50 is ground to a prescribed thickness. Then, dots 13 having a prescribed size and height are formed on the surface by sandblasting technique.

Thus, the electrostatic chuck 110 can be obtained.

Figure 13:
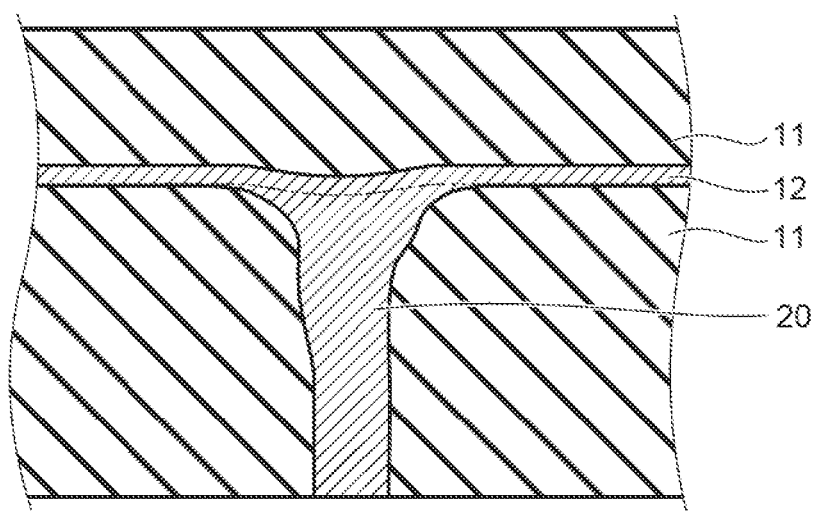
FIG. 13 shows an example of the connecting part.

FIG. 13 shows an example of the connecting part.

FIG. 13 is a sectional view of the connecting part 20 after manufacturing. The connecting part 20 shown in FIG. 13 is manufactured by the aforementioned method based on HIP processing.

The outer shape of the connecting part 20 in sectional view is curved. This connecting part 20 has a shape (generally horn-like shape) such that the increase rate of the outer diameter gradually increases toward the electrode 12. In practice, the outer shape of the connecting part 20 in sectional view may fail to form a clean curve depending on the material, manufacturing condition and the like. Furthermore, the increase rate of the outer diameter of the connecting part 20 may increase stepwise, besides continuously increasing, toward the electrode 12.

Next, the aspect ratio of the connecting part 20 is described.

Figures 14A, 14B:
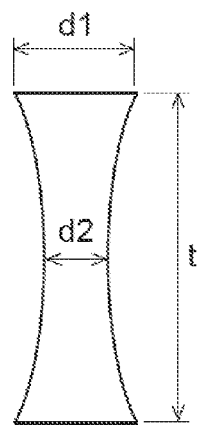
FIG. 14A and FIG. 14B show the relationship between the aspect ratio and the electrical continuity characteristic of the connecting part.

FIG. 14A and FIG. 14B show the relationship between the aspect ratio and the electrical continuity characteristic of the connecting part.

FIG. 14A shows the definition of dimensions of the connecting part 20. More specifically, the outer diameter of the connecting part 20 at the contact surface with the electrode 12 is denoted by d1. The height t of the connecting part 20 is the height obtained when the distance between two convex curves drawn radially inward from both ends of the outer diameter d1 is equal to d1. The smallest outer diameter d2 of the connecting part 20 is the minimum distance between two convex curves drawn radially inward from both ends of the outer diameter d1.

FIG. 14B shows various aspect ratios (t/d2) of the connecting part 20, the electrical continuity state between the connecting part 20 and the electrode 12, and the pass/fail determination result.

The aspect ratio (t/d2) of the connecting part 20 is set to 1.4, 1.5, 2, 5, 10, 15, 20, and 30. It is found that favorable electrical continuity cannot be obtained in the case of the aspect ratio (t/d2) being 1.4 or less and 30 or more.

When the aspect ratio (t/d2) of the connecting part 20 is 1.4 or less, the central portion at the contact surface of the connecting part 20 with the electrode 12 has a large inward warpage (deformation), failing to obtain favorable electrical continuity with the electrode 12. When the aspect ratio (t/d2) of the connecting part 20 is 30 or more, the electrical continuity contact area in the outer diameter d2 portion is made small, failing to obtain favorable electrical continuity.

From the above result, the aspect ratio (t/d2) of the connecting part 20 is 1.5 or more and 20 or less, preferably 2 or more and 15 or less, and more preferably 2 or more and 10 or less. If the connecting part 20 has such an aspect ratio, favorable electrical continuity between the connecting part 20 and the electrode 12 is obtained even in the case of forming an electrostatic chuck by HIP processing.

As described above, this embodiment can provide an electrostatic chuck 110 having high reliability by reliable electrical continuity between the electrode 12 inside the ceramic dielectric substrate 11 and the connecting part 20.

The embodiments of the invention have been described above. However, the invention is not limited to the above description. Those skilled in the art can appropriately modify the above embodiments, and such modifications are also encompassed within the scope of the invention as long as they include the features of the invention. Furthermore, various components in the above embodiments can be combined with each other as long as technically feasible. Such combinations are also encompassed within the scope of the invention as long as they include the features of the invention.

[Industrial Applicability]

The embodiments of the invention provide an electrostatic chuck capable of achieving high reliability by reliable electrical continuity between the internal electrode and the connecting part.

REFERENCE SIGNS LIST 11 ceramic dielectric substrate
11a first major surface
11b second major surface
12 electrode
13 dot
14 groove
15 recess
15a bottom surface
17 contact part
17a conductive film
17h hole
18 conductive material
20, 20A, 20B, 20C connecting part
20h hole
21 first region
21a portion
22 second region
25 connecting part material film
30 conductive member
40 electrical continuity member
50 base plate
50a upper part
50b lower part
51 input path
52 output path
53 introduction path
55 communication path
57 hole
61 contact electrode
62 insulating material
80 clamping voltage
110 electrostatic chuck
CR circle
L1 extension line
L2 tangential line
S1 outline
S2 outline
W object to be clamped
d, d1, d2, d3, da, db outer diameter
p0, p1, p2 intersection point
r radius
t1, t2 thickness
θ angle

The invention claimed is:

1. An electrostatic chuck comprising:
a ceramic dielectric substrate having a first major surface for mounting an object to be clamped and a second major surface on opposite side from the first major surface;
an electrode interposed between the first major surface and the second major surface of the ceramic dielectric substrate; and
a connecting part connected to the electrode on a side of the second major surface of the ceramic dielectric substrate and including a first region in contact with the electrode, with a first direction being defined as a direction from the first major surface toward the second major surface, and a second direction being defined as a direction orthogonal to the first direction, the first region being configured so that in a cross section of the electrode and the connecting part as viewed in the second direction, an angle on a side of the connecting part between a first line extending along an outer surface shape of the electrode on a side of the second major surface of the ceramic dielectric substrate and a second line extending tangentially to an outer surface shape of the connecting part gradually increases as the second line is moved along the outer surface shape of the connecting part in the first direction.

2. The electrostatic chuck according to claim 1, wherein the angle is an acute angle.

3. The electrostatic chuck according to claim 2, wherein the ceramic dielectric substrate includes a portion being convex in the first direction at a position overlapping the connecting part as viewed in the first direction on a side connected to the electrode.

4. The electrostatic chuck according to claim 2, wherein the connecting part includes a second region provided between the first region and the second major surface and having a diameter gradually increasing in the first direction.

5. The electrostatic chuck according to claim 1, wherein the ceramic dielectric substrate includes a recess extending from the second major surface to the connecting part, and the chuck further comprises a conductive member in electrical continuity with the connecting part exposed at a bottom surface of the recess.

6. The electrostatic chuck according to claim 5, wherein the bottom surface has a curved surface.

7. The electrostatic chuck according to claim 1, wherein material of the connecting part includes a same kind of metal as material of the electrode.

8. The electrostatic chuck according to claim 7, wherein the material of the connecting part also includes a same kind of material as material of the ceramic dielectric substrate.

9. The electrostatic chuck according to claim 5, wherein area of the bottom surface as viewed in a direction opposite from the first direction is larger than area of the connecting part exposed at the bottom surface as viewed in the direction opposite from the first direction.

10. The electrostatic chuck according to claim 5, including:
a plurality of the connecting parts,
wherein the ceramic dielectric substrate includes a plurality of said recess extending from the second major surface to the connecting part, and
the plurality of connecting parts being respectively provided in the recesses.

11. The electrostatic chuck according to claim 1, wherein a smallest outer diameter d2 of the connecting part is 1 millimeter or less.

12. The electrostatic chuck according to claim 1, wherein d1/d2 is more than 1 and less than 4, wherein d1 is an outer diameter of the connecting part at the contact surface with the electrode, d2 is a smallest outer diameter of the connecting part.

13. The electrostatic chuck according to claim 1, wherein an aspect ratio t/d2 of the connecting part is 1.5 or more and 20 or less, wherein t is a height of the connecting part and d2 is a smallest outer diameter of the connecting part.

14. The electrostatic chuck according to claim 1, wherein the ceramic dielectric substrate, the electrode, and the connecting part are integrally sintered.

15. The electrostatic chuck according to claim 1, wherein a laminated body including the electrode and the connecting part is formed by sintering a plurality of green sheets including a metallized paste constituting the electrode and a metallized paste constituting the connecting part, the sintering involving hot isostatic pressing processing.

* * * * *